(12) United States Patent
Hencken et al.

(10) Patent No.: US 11,609,259 B2
(45) Date of Patent: Mar. 21, 2023

(54) METHOD FOR DETECTING AN ELECTRICAL DISCHARGE IN AN ELECTRICAL APPARATUS AND A SYSTEM THEREFOR

(71) Applicant: ABB Schweiz AG, Baden (CH)

(72) Inventors: Kai Hencken, Lörrach (DE); Yannick Maret, Dättwil (CH); Jörg Gebhardt, Mainz (DE); Holger Kaul, Mannheim (DE); Jörg Lehmann, Basel (CH); Andrej Krivda, Wettingen (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/363,724

(22) Filed: Jun. 30, 2021

(65) Prior Publication Data

US 2021/0405106 A1  Dec. 30, 2021

(30) Foreign Application Priority Data

Jun. 30, 2020  (EP) ..................................... 20183241

(51) Int. Cl.
*G01R 31/00* (2006.01)
*G01R 31/12* (2020.01)

(52) U.S. Cl.
CPC ................ *G01R 31/1209* (2013.01)

(58) Field of Classification Search
CPC G01R 31/12; G01R 31/1209; G01R 31/1272; G01R 31/3275; G01R 19/04
See application file for complete search history.

(56) References Cited

U.S. PATENT DOCUMENTS

| 6,774,639 B1 * | 8/2004 | Unsworth | ............... | H01H 33/26 324/536 |
| 2009/0146666 A1 * | 6/2009 | Ohtsuka | ............. | G01R 31/1272 324/96 |

(Continued)

FOREIGN PATENT DOCUMENTS

| CN | 101650407 | * | 2/2010 |
| CN | 101650407 A | | 2/2010 |

(Continued)

OTHER PUBLICATIONS

European Patent Office, Extended European Search Report in European Patent Application No. 20183241.7, 9 pp. (dated Dec. 3, 2020).

*Primary Examiner* — Thang X Le
(74) *Attorney, Agent, or Firm* — Leydig, Voit & Mayer, Ltd.

(57) ABSTRACT

The present disclosure provides a method for detecting an electrical discharge in an electrical apparatus. The method includes sensing an electromagnetic wave using an electrical sensor and generating an electric signal for a predetermined time period, sensing an acoustic wave using an acoustic sensor and generating an acoustic signal for the predetermined time period. The acoustic sensor is associated with at least one compartment of the electrical apparatus. Electrical data is generated based on a quasi-periodic characteristic of electric peak sequences of the electrical signal. Acoustic data is generated based on a quasi-periodic characteristic of acoustic peak sequences of the acoustic signal, wherein the electrical data is combined with the acoustic data to provide an operation status of the at least one compartment.

12 Claims, 5 Drawing Sheets

(56) References Cited

U.S. PATENT DOCUMENTS

| | | | |
|---|---|---|---|
| 2011/0172970 A1* | 7/2011 | Kang | G01R 31/1254 |
| | | | 702/191 |
| 2014/0172327 A1* | 6/2014 | Zhou | G01R 31/1209 |
| | | | 702/58 |
| 2014/0233686 A1* | 8/2014 | Choi | G01N 29/4463 |
| | | | 375/349 |
| 2015/0260777 A1* | 9/2015 | Di Stefano | G01R 31/1227 |
| | | | 324/536 |
| 2016/0341782 A1* | 11/2016 | Huang | G01R 31/1209 |
| 2019/0064243 A1 | 2/2019 | Codd et al. | |

FOREIGN PATENT DOCUMENTS

| | | |
|---|---|---|
| CN | 106841939 A | 6/2017 |
| CN | 107942207 A | 4/2018 |
| CN | 108710074 A | 10/2018 |
| KR | 10-2013-0028545 A | 3/2013 |
| KR | 20130028545 * | 3/2013 |

\* cited by examiner

METHOD FOR DETECTING AN ELECTRICAL DISCHARGE IN AN ELECTRICAL APPARATUS AND A SYSTEM THEREFOR

CROSS-REFERENCE TO RELATED APPLICATIONS

This patent application claims the benefit of European Patent Application No. 20183241.7, filed Jun. 30, 2020, which is fully incorporated herein by reference for all purposes.

FIELD

Embodiments of the present disclosure relate generally to a method for detecting an electrical discharge in an electrical apparatus. Further embodiments of the present disclosure relate to a detection system for detecting an electrical discharge in an electrical apparatus, particularly a detection system for carrying out said method.

BACKGROUND

Electrical apparatuses are in particular medium-voltage or high-voltage electrical switchgear, they may be susceptible to electrical discharges occurring in various components of the apparatus. A focus for monitoring of an electrical apparatus is the detection and classification of electrical discharges, in particular partial discharges, which may occur in defective components of the electrical apparatus. Several different types of partial discharge may occur, including a partial discharge occurring in a void of an insulating component, a partial discharge occurring at a surface of an insulating component, or a partial discharge occurring at the surface of metallic parts such as corona shields.

Partial discharge (PD) detection is an important tool for monitoring insulation conditions in high voltage devices in power systems. As the insulation may breakdown due to mechanical, thermal and electrical stresses, resulting in a failure of the equipment. Therefore, it is important to have a system to detect and locate this phenomenon within devices.

Partial discharge can be described as an electric pulse or discharge in a gas-filled void or on a dielectric surface of a solid or liquid insulation system and around sharp protrusions. This pulse or discharge only partially bridges the gap between phase insulation to ground or phase to phase insulation. These discharges might occur in any defect between conducting elements at different electrical potentials. In particular, these discharges might occur in any area between conductors or between conductor and grounded part, where the local field exceeds the breakdown field of the material. The defects may be located between the copper conductor and isolation wall, or internal to the insulation itself, between the outer insulation wall and the grounded frame, or along the surface of the insulation. The pulses can contain a broad spectrum of frequencies.

Whereas it is not fully clear that partial discharges are a causal or necessary precursor to an imminent breakdown of an electric system, they are known to be present in a larger number of cases, where breakdown later occurred. Several measurement systems or approaches exist (capacitive, inductive, UHF, acoustic, etc. . . . ) with the aim to identify the short pulses corresponding to the discharges occurring at critical voltages or times. The main aim of an analysis is to identify the defect either with respect to its type or its origin.

The localization of the origin of the defect is important especially for measurement systems, that can cover a larger range of equipment in order to allow for repair or replacement to be done on those parts with the defect. In addition, PD measurements are difficult with respect to possible external disturbances, which can be due to external sources, not related to partial discharge or due to discharges occurring outside the monitored area.

Thus, there is a need for solutions to improve and simplify the detection and/or localization of electrical discharges in an electrical apparatus.

SUMMARY OF THE INVENTION

An object of the invention can be considered to provide an improved method for detecting electrical discharges within an electrical apparatus According to a first aspect of the present disclosure, a method for detecting electrical discharges Method for detecting an electrical discharge in an electrical apparatus, the method comprises a sensing an electromagnetic wave using an electrical sensor and generating an electric signal for a predetermined time period; sensing an acoustic wave using an acoustic sensor and generating an acoustic signal for the predetermined time period, said acoustic sensor being associated with at least one compartment of the electrical apparatus; generating electrical data based on a quasi-periodic characteristic of electric peak sequences of said electrical signal; generating acoustic data based on a quasi-periodic characteristic of acoustic peak sequences of said acoustic signal, wherein the electrical data is combined with the acoustic data to provide an operation status of the at least one compartment.

According to a second aspect of the present disclosure, a detection system for detecting an electrical discharge Detection system for detecting an electrical discharge in an electrical apparatus, the system comprises an electrical sensor configured to measure an electromagnetic signal; an acoustic sensor configured to measure an acoustic signal, said acoustic sensor being associated with at least one compartment of the electrical apparatus; and a signal processing device configured for generating electrical data based on a quasi-periodic characteristic of electrical peak sequences of said electrical signal and for generating acoustic data based on a quasi-periodic characteristic of acoustic peak sequences of said acoustic signal, wherein the signal processing device is configured to combine the electrical data with the acoustic data to provide an operation status of the at least one compartment.

Aspects, benefits, and features of the present disclosure are apparent from the claims, the description, and the accompanying drawings.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF THE EMBODIMENTS

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

With exemplary reference to FIGS. 1 to 5, embodiments of a method for detecting an electrical discharge in an electrical apparatus according to the present disclosure is described. According to embodiments which can be combined with other embodiments described herein the method for detecting an electrical discharge 1 in an electrical apparatus 5 includes sensing an electromagnetic wave 4 using an electrical sensor 101 and generating an electric signal SE for a predetermined time period T1, in particular during a predetermined time period T1.

Figure 1:
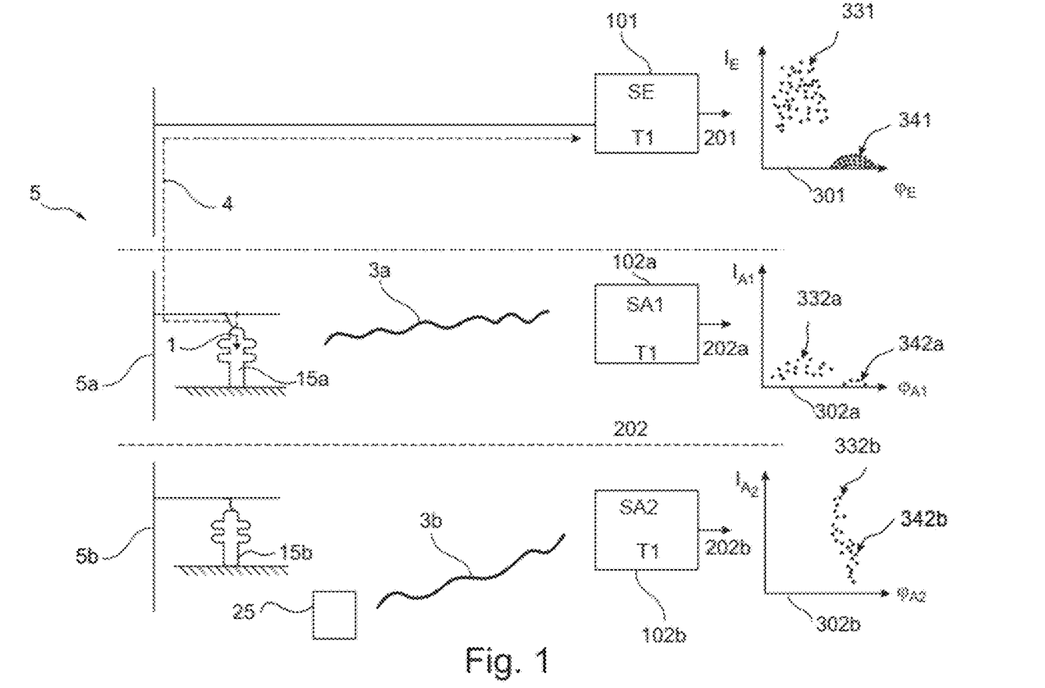
FIG. 1 illustrates schematically a sectional view of an electrical apparatus including an electrical sensor and two acoustic sensors; based on the measured signals the electrical data and the two acoustic data can be compared as depicted in respective graphs.

The method further includes sensing an acoustic wave 3 using an acoustic sensor 102 and generating an acoustic signal SA for the predetermined time period T1, said acoustic sensor 102 being associated with at least one compartment 5a of the electrical apparatus 5. The method further includes generating electrical data 201 based on a quasi-periodic characteristic of electric peak sequences of said electrical signal SE and generating acoustic data 202 based on a quasi-periodic characteristic of acoustic peak sequences of said acoustic signal SA, wherein the electrical data 201 is combined with the acoustic data 202 to provide an operation status of the at least one compartment 5a.

By comparing the electrical data with the acoustic data, it is possible to relate electrical discharges measured in the electric signal for the electrical apparatus as a whole to the at least one compartment where the acoustic wave is measured by the acoustic sensor. Taking advantage of the quasi-periodic characteristics of both the electric peak sequences and the acoustic peak sequences, the electrical data and the acoustic data can be combined based on, specific parameters of periodic functions.

The quasi-periodic characteristic of the electric and the acoustic peak sequences is based on the assumption that the occurrence of electrical discharges is strongly related with the grid frequency. What is more, it can be also based on the idea that the occurrence of electrical discharges is strongly driven by the oscillating nature of the AC grid voltage. As for example, the counts of the number and/or the intensities of said measured electric and acoustic peak sequences can be related to the phase angle, in particular of the voltage across the insulator. The electrical data can, for example, include a phase resolved discharge (PRPD) pattern of the electric signal. The term "quasi-periodic signal" can also be understood that a probability of occurrence of electric pulses is modulated by the grid frequency, which is a periodic function. It may have major frequency components e.g. close to the grid frequency or close to a multiple of the grid frequency or perhaps having some other relationship. The pulses' occurrence is stochastic in nature and not deterministic, being influenced e.g. by other, sometimes rapidly fluctuating, physical circumstances. Therefore, the occurrence of the pulses will vary each time to some extent and a periodic pattern is only visible when determining the underlying probability. This behavior is termed "quasi-periodic" in this context. Likewise, the acoustic data can include a PRPD pattern of the acoustic signal. The phase angle of the acoustic signal can be determined by measuring the voltage in the acoustic sensor separately and/or by embodiments of the method as described herein.

Because the signals will not compare directly with each other but only the respective electrical and acoustic data, the sensing of the electromagnetic wave and the sensing of the acoustic wave can be carried out independently from each other. In particular, the electric signal and the acoustic signal do not need to be sensed in a time synchronous manner, which makes the method easier and inexpensive.

Combining the electrical data and the acoustic data allows to correlate the electrical signal and acoustic signal with each other. In particular, the electric peak sequences and the acoustic peak sequences can be correlated with each other which enables to compare the electrical discharge pattern occurred in electric apparatus and the electrical discharge pattern in the at least one compartment associated with the acoustic sensor. Thereby the electrical discharge pattern of the electrical apparatus and the acoustic discharge pattern can be compared based on statistic similarities in both respective discharge patterns whereby information about the operating status of the at least one compartment can be obtained. In particular, the higher the statistic similarities between electric and the acoustic discharge pattern the more likely the electrical discharges occurred in the at least one compartment associated with the acoustic sensor. Thus, it is possible to improve the troubleshooting and the monitoring in the electrical apparatus.

FIG. 1 shows a schematic embodiment of an electrical apparatus 5 including two acoustic sensors 102a, 102b. The electrical sensor 101 and the two acoustic sensor 102a, 102b measure for a predetermined time period T1. Within said time period T1 an electrical discharge 1 occurs at an electrical component 15a within the first compartment 5a which results in an electromagnetic wave 4, schematically shown by the dashed line. The electromagnetic wave 4 is recorded by the electrical sensor 101. The electrical discharge 1 also generates an acoustic wave 3a which is measured by the first acoustic sensor 102a being assigned to the first compartment 5a.

The electrical data 201 is generated based on the quasi-periodic characteristic of the electrical peak sequences of the electrical signal 4 sensed by the electrical sensor 101. The electrical data 201 is shown as an electric PRPD pattern in graph 301. The intensity $I_E$ of the electrical signal SE is plotted vs the phase angle $\varphi_E$ of the electrical signal SE. The electrical discharge 1 also generates a first acoustic wave 3a, which is sensed by the acoustic sensor 102a of the first compartment 5a. Whereas the electrical sensor in general will measure at the same time the grid voltage and can therefore determine frequency and phase of it, this is in general more difficult for an acoustic sensor. But it is also possible to extract the intensity $I_E$ and the phase angle $\varphi_E$ from the sequence itself.

The acoustic data 202 includes first acoustic data 202a which is generated based on the quasi-periodic characteristic of the acoustic peak sequences of the first acoustic signal SA1 and second acoustic data 202b which is generated based on the quasi-periodic characteristic of the acoustic peak sequences of the second acoustic signal SA2. In this example, no electrical discharge 1 occurred at the second electrical component 15b within the predetermined time period T1. A second acoustic wave 3b was sensed by the second acoustic sensor 102b in the second compartment 5b within a predetermined time period T1. The second acoustic wave 3b comes from a disturbance source 25 located within or nearby the second compartment 5b. Thus, the second acoustic signal SA2 is based on a different acoustic wave than the first acoustic signal SA1.

The first acoustic data 202a is shown as a first acoustic PRPD pattern in graph 302a, wherein the intensity $I_{A1}$ of the first acoustic signal SA1 is plotted vs the phase angle $\varphi_{A1}$ of the first acoustic signal SA1. The second acoustic data 202b is shown as a second acoustic PRPD pattern in graph 302b, wherein the intensity $I_{A2}$ of the second acoustic signal SA2 is plotted vs the phase angle $\varphi_{A2}$ of the second acoustic signal SA2. The phase angles $\varphi_{A1}$ and $\varphi_{A2}$ of the respective acoustic signals can, for example, be determined by separate voltage measurements and/or by statistical methods according to embodiments described herein.

To monitor or localize the electrical discharge 1 within the electrical apparatus 5 the electrical data 201 is combined with the acoustic data 202. In particular, the graph 301 showing the PRPD pattern of the electrical apparatus 5 can be compared in a statistical manner with the graph 302a and the graph 302b showing the PRPD pattern of the first and the second acoustic signals, respectively.

The electric PRPD pattern depicted in graph 301 includes a first cluster 331 and a second cluster 341. Furthermore, the first acoustic PRPD pattern depicted in graph 302a includes a first cluster 332 and a second cluster 342 and likewise the second acoustic PRPD pattern depicted in graph 302b includes a first cluster 332b and a second cluster 342b. The combination of the electrical data 201 with the acoustic data 202 can, for example, be performed by a using normalized cross-correlation algorithm, which determines the statistical similarity between the electric signal SE and the first acoustic signal SA1 and the second acoustic signal SA2.

Accordingly, the higher the statistical similarity between the electric signal SE and one of the first acoustic signal SA1 and the second signal SA2, the more likely the electric discharge 1 occurred in the compartment associated with the respective acoustic signal having a higher statistical similarity with the electric signal SE. In other words, the electrical discharge 1 occurred more likely in the specific compartment which is associated with the acoustic sensor which has sensed the acoustic signal having a higher statistical similarity with the electric signal.

In the present example, shown in FIG. 1, the first acoustic signal SA1 has a higher statistical similarity with the electric signal SE than the second acoustic signal SA2. In particular, the electric PRPD pattern including the first cluster 331 and the second cluster 341 shown in graph 301 has a higher statistical similarity with the first acoustic PRPD pattern including the first cluster 332a and the second cluster 342a shown in graph 302a than with the second acoustic PRPD pattern including the first cluster 332b and 342b shown in graph 302b.

In the present example, shown in FIG. 1 combining the electric data 201 with the acoustic data 202 would provide an operation status for the first compartment 5a and the second compartment 5b, namely by indicating that the partial discharge 1 occurred with a higher probability in the first compartment 5a and not in the second compartment 5b of the electrical apparatus 5. The method as described based on FIG. 1 can also be carried out for a plurality of electrical discharges 1. The predetermined time period T1 can be for example between 10 min and 1 h.

Figure 2:
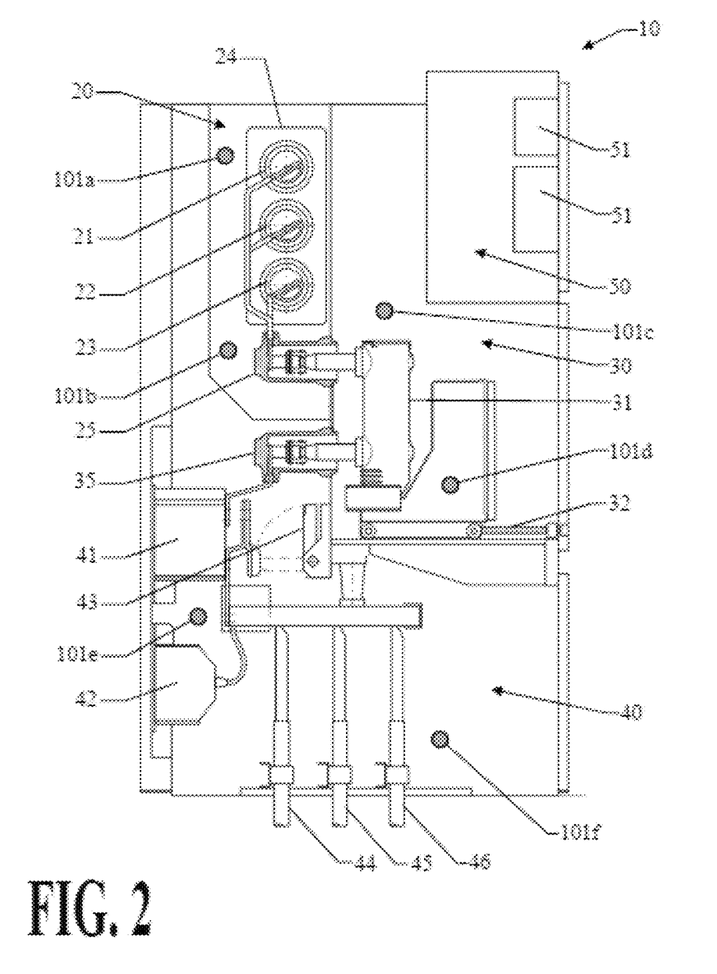
FIG. 2 illustrates an internal side view of an electrical switchgear having a detection system according to embodiments of the present disclosure.

Reference will be now made to FIG. 2, which shows an internal side view of an electrical apparatus 5. In particular, the electrical apparatus exemplarily shown in FIG. 2 is a three-phase electrical switchgear 10, however the present disclosure is not limited thereto. The electrical apparatus may be divided into a plurality of compartments, and each respective compartment may be provided to house components of the electrical apparatus. As exemplarily shown in the electrical switchgear 10 of FIG. 2, the plurality of compartments may include, for example, a busbar compartment 20, a circuit breaker compartment 30, a cable terminal compartment 40 and a control compartment 50. Each respective compartment is provided for separating groups of components.

A busbar compartment 20 is provided to house a plurality of busbars. In the exemplary three-phase electrical switchgear 10, three busbars 21, 22, 23 are provided. Busbars 21, 22, 23 serve as the connections of the electrical switchgear 10, and extend horizontally and protrude out of busbar compartment 20 such that busbars 21, 22, 23 may be connected to the respective busbars of a neighbouring electrical switchgear. Busbars 21, 22, 23 may be supported by at least one insulating busbar support 24, and may include a plurality of insulators. Busbar support 24 may be constructed so as to support all three busbars 21, 22, 23 simultaneously. Each one of busbars 21, 22, 23 may be connected to each respective one of a plurality of bushings or contact fingers 25, wherein bushings or contact fingers 25 are provided to pass through a separating wall between busbar compartment 20 and circuit breaker compartment 30.

Circuit breaker compartment 30 is provided to house a plurality of circuit breakers 31. An input side of each one of circuit breakers 31 is connected to each respective one of bushings or contact fingers 25. An output side of each one of circuit breakers 31 are connected to each respective one of bushings or contact fingers 35 provided to pass through a separating wall between circuit breaker compartment 30 and cable terminal compartment 40. As exemplarily shown in the electrical switchgear of FIG. 2, bushings or contact fingers 25, 35 are configured to be pluggable components, such that circuit breakers 31 may be plugged and unplugged from bushings or contact fingers 25, 35 by moving circuit breakers 31 on drawers 32.

A cable terminal compartment 40 is provided to house a variety of components in the exemplary electrical switchgear 10. In particular, cable terminal compartment 40 houses current transformers 41, voltage transformers 42, earthing switches 43 and cable terminations 44, 45, 46. An input side of each one of voltage transformers 42 is connected to each respective one of bushings or contact fingers 35. Cable terminations 44, 45, 46 serve as the connections of the electrical switchgear, and are exemplarily provided to pass through a floor panel of the electrical switchgear 10.

A control compartment 50 is provided to house a variety of control components 51 in the exemplary electrical switchgear 10. The control components 51 may include, for example, at least one of a controller, a monitoring device, a data logging device or a display device. Providing such control components 51 in a separate compartment allows for the control components 51 to be electrically shielded from other compartments and other components in the electrical switchgear 10 which operate at significantly higher voltages than the control components 51, preventing electrical interference and erroneous operation of the control components 51.

Figure 3:
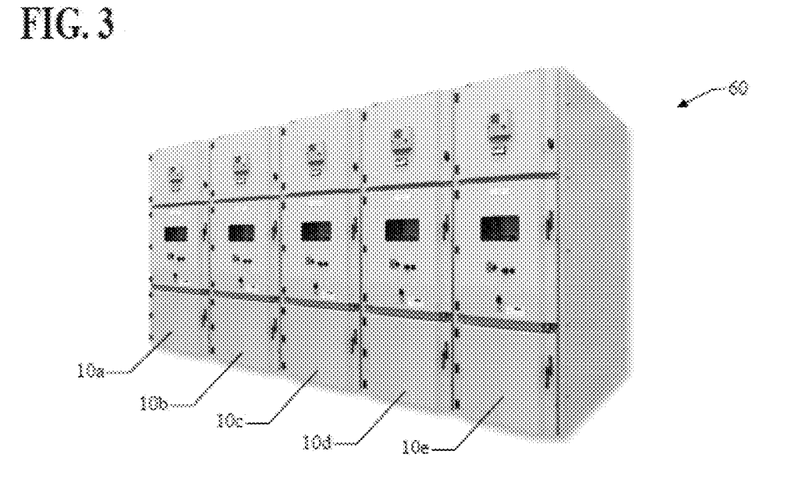
FIG. 3 illustrates schematically a perspective view of a plurality of electrical switchgear having a detection system according to embodiments of the present disclosure.

Referring now to FIG. 3, a plurality of the electrical switchgear 10a-e exemplarily shown in FIG. 2 may be provided. The plurality of electrical switchgear 10a-e may be installed side-by-side such that busbars of one electrical switchgear are connected to the busbars of the neighbouring electrical switchgear to form a bank of electrical switchgear 60. Five electrical switchgear 10a-e are exemplarily provided in the bank of electrical switchgear 60 of FIG. 3, however any number of electrical switchgears 10a-e may be provided.

The electrical apparatus, may be, for example, a medium- or high-voltage electrical apparatus. In the context of the present disclosure, the term "medium-voltage" may refer to a voltage of at least 1 kV. Particularly, the term "medium-voltage" may refer to a voltage of at least 600V. Further, the term "high-voltage" in the context of the present disclosure may refer to a voltage of at least 69 kV. Particularly, the term "high-voltage" may refer to a voltage of at least 69 kV and up to 230 kV or more.

Although the electrical apparatus exemplarily shown in FIGS. 2 and 3 is an electrical switchgear, the present disclosure is not limited thereto. The electrical apparatus, particularly the medium- or high-voltage electrical apparatus, may be at least one of the group comprising an electrical air-insulated switchgear, an electrical gas-insulated switchgear, an air-insulated electrical transformer, a gas-insulated electrical transformer, or an electrical motor. The electrical apparatus may be an electrical device configured for alternating current or direct current.

The term "electrical discharge" can be also understood as a localized dielectric breakdown and can also include a partial electrical discharge. The electrical discharge can occur at an electrical component within an electric apparatus. An electric discharge, in particular an electric discharge event dissipates energy in the form of electromagnetic waves, heat, sounds and light. In other words, a single occurrence of an electrical discharge in an electrical apparatus emits energy, particularly pulses of energy in the form of an electromagnetic wave and an acoustic wave, among other. The electromagnetic wave and the acoustic wave can be detected or sensed by the respective sensors.

The term "electrical apparatus" can be for example understood as a switchgear but the present disclosure is not limited thereto. The electrical apparatus can be a medium- or high voltage electrical apparatus and may be at least one of the groups comprising an electrical transformer, a gas-insulated electrical transformer or an electrical motor. The electrical apparatus may be an electrical device configured for alternating current or direct current.

The electrical apparatus can include at least one compartment, in particular the electrical apparatus can include a plurality of compartments. It can also be understood that the electrical apparatus is divided in a plurality of compartments. A compartment can be understood as a part or a section of the electrical apparatus in which electrical components may be provided.

The term "electrical sensor" can also be understood as a sensing device which is capable and/or configured to sense or detect an electromagnetic wave. It can also be understood that the electric sensor measures a voltage drop due to the electrical discharge. The electrical sensor, for example, can include or can be an antenna. The electrical sensor can also include an UHF sensor (ultra-high-frequency sensor). The term "acoustic sensor" can also be understood as a sensing device which is capable and/or configured to sense or detect an acoustic wave. The acoustic sensor can, for example, include or can be a microphone. The term "sensing" can also be understood as detecting, measuring or recording the respective electromagnetic or acoustic signal.

The term "predetermined time period" can denote a time period in which the respective sensor detects and measures the electromagnetic wave and the acoustic wave, respectively. Accordingly, the generated electric signal and the acoustic signal can be recorded during the predetermined time period. The predetermined time periods can be for example between 0.02 min and 72 hours, in particular between 1 min and 24 hours, or more particularly between 10 min and 1 hour.

The term "being associated with" can also be understood as the respective acoustic sensor is configured and/or capable to sense acoustic waves occurring within the compartment said acoustic sensor is assigned to. The acoustic sensor can be, for example, arranged within said compartment or can be arranged next to the compartment. The sensor can be also be arranged at or within a wall of the compartment.

The term "generating electrical data based on a quasi-periodic characteristic of electrical peak sequences of said electrical signal" can also be understood that in the electrical signal the amplitude or the intensity is correlated with the phase angle. For example, a PRPD pattern can be generated for each electrical signal. In the generated PRPD pattern the phase angle of the power line voltage phase, denoting the x-Axis, can be related to the intensity of the signal denoting the y-Axis. The intensity can be, for example, include the amplitude, e. g. the integrated peak height of the voltage measured by, for example capacitive sensor, the squared amplitude of the voltage, or the counts of the partial discharges.

Likewise, the term "generating acoustic data based on a quasiperiodic characteristic of acoustic peak sequences of said acoustic signal" can also be understood that the acoustic signal is transformed from a time domain into a frequency domain, for example by using Fourier analysis or similar analysis for periodic functions. Analogously to the electric signal an acoustic pattern can be generated for each acoustic signal. The missing power voltage phase can be, for example, provided by a separate voltage measurement for the acoustic sensor and/or by statistical methods according to embodiments described herein. The quasi-periodic characteristic of the electric and the acoustic peak sequences is used based on the assumption that the occurrence of electrical discharges is strongly related with the voltage power line of the electrical apparatus, in particular the grid frequency. Advantageously, thereby the measurement of the electric signal and the measurement of the acoustics signals do not need to be measured in a time synchronous manner.

The term "combining" the electrical data with acoustic data can be understood that the frequency domains of both the electric and the acoustic signal, in particular the respective PRPD pattern of the electric and the acoustic signals are combined. Combining can also include fusing and/or comparing. In particular, the term "combining" can also be understood as comparing the electrical data and the acoustic data based on statistical manner or features. The electrical data can, for example, statistically compared with the acoustic data by means of a normalized cross-correlation algorithm.

By performing a normalized cross-correlation for the electrical data and the acoustic data a correlation coefficient can be provided. The correlation coefficient can have values between −1 and +1 depending on the statistical similarity of the acoustic and the electric data. The value of the correlation coefficient can provide a measure of the statistical similarity of the electrical data and the acoustic data. The higher the similarity of the electrical data and the acoustic data, the more likely the electrical discharges occurred in the at least one compartment associated with the acoustic sensor which sensed said acoustic signal, on the basis of which said acoustic data was generated.

By combining the electrical data and the acoustic data an operation status can be provided. The operation status may be indicative of a defect of a component arranged in the at least one compartment. Thereby, the localization of a defect component within the electrical apparatus can be facilitated.

According to embodiments which can be combined with other embodiments described herein, the acoustic signal can be measured by at least two acoustic sensors, the first acoustic sensor measures a first acoustic signal and a second acoustic sensor measures a second acoustic signal, the first acoustic sensor is associated with a first compartment of the electrical apparatus and the second acoustic sensor is associated with a second compartment of the electrical apparatus.

Thereby, it is possible to sense different acoustic waves in different compartments which can facilitate the localization of defect components in the electrical apparatus. The acoustic data can include a first acoustic data of the first acoustic signal and a second acoustic data of the second acoustic signal. The first acoustic data of the first acoustic signal and the second acoustic data of the second acoustic signal can also be combined separately with the electrical data to provide an operation status for each of the first and the second compartment. According to embodiments the acoustic signal can also be measured by a plurality of acoustic sensor wherein each of the sensor is assigned to a specific compartment of the electrical apparatus.

According to embodiments which can be combined with other embodiments described herein, the acoustic sensor can also be associated with two or more compartments. The acoustic sensor can also be associated with a plurality of compartments. According to embodiments, which can be combined with other embodiment described herein, a plurality of components can be located in one compartment. In particular, one compartment can include only specific components of the electrical apparatus.

According to embodiments, which can be combined with other embodiments described herein, the electrical signal is generated only in at least one time period interval for the predetermined time period. According to embodiments, which can be combined with other embodiments described herein, the electrical signal is generated only in at least two time period intervals for the predetermined time period. Advantageously, the electrical apparatus can be, for example, monitored for a longer predetermined period of time without generating to much data. The electric signal can also be measured in sections within the predetermined time period. According to embodiments which be combined with other embodiments described herein, a time period interval can be, for example, between 0.02 seconds and 24 hours, in particular between 10 min and 1 hour.

According to embodiments, which can be combined with other embodiments described herein, the acoustic signal is generated only in at least one time period interval for the predetermined time period. According to embodiments, which can be combined with other embodiments described herein, the acoustic signal is generated only in at least two time period intervals for the predetermined time period. Advantageously, the respective compartment can be, for example, monitored over a longer period of time without generating to much data. The acoustic signal can also be measured in sections within the predetermined time period. According to embodiments which be combined with other embodiments described herein, a time period interval can be, for example, between 0.02 seconds and 24 hours, in particular between 10 min and 1 hour.

According to embodiments which can be combined with other embodiments described herein the at least one time period interval of the electrical signal and the at least one time period interval of the acoustic signal are independent from each other in time. According to embodiments which can be combined with other embodiments described herein the at least two time period intervals of the electrical signal and the at least two time period intervals of the acoustic signal are independent from each other in time. The at least one time period interval of the electrical signal and the at least one time period interval of the acoustic signal can also not overlap in time. The term not overlap in time can also be understood as the a time period interval of the electric signal and the acoustic signal are non-overlapping or do not have a time overlap with each other.

According to embodiments which can be combined with other embodiments described herein the predetermined time period is a continuous time period.

Figure 4:
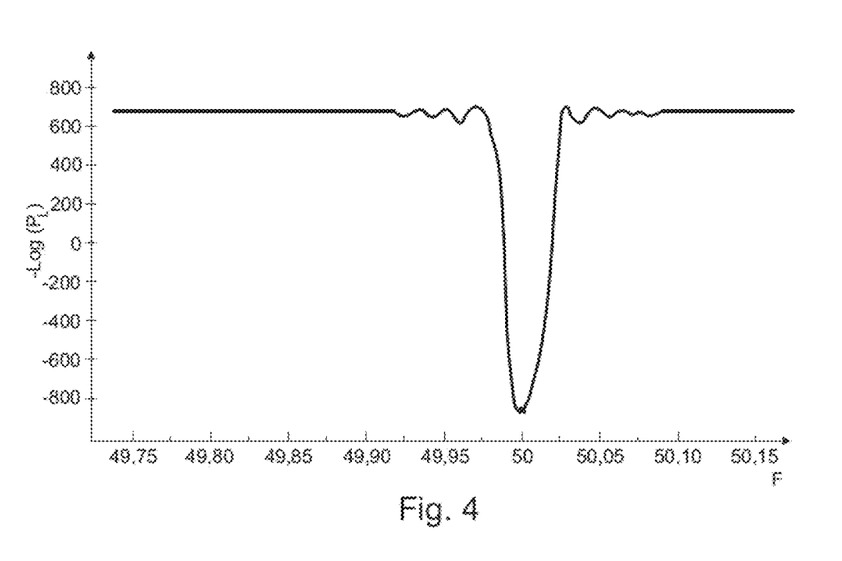
FIG. 4 illustrates schematically a method for determining the frequency in the acoustic signal by parameter maximizing.

According to embodiments which can be combined with other embodiments described herein, generating acoustic data further includes determining a frequency F of the acoustic peak sequences of the acoustic signal using parameter maximization. The term using parameter maximization can also be understood as using an optimization algorithm as a function of possible frequencies F. For example, a maximum likelihood estimation approach can be used. For example, maximizing or minimizing some metric for the agreement between the periodicity and an underlying periodic function can be used. The determined frequency F can also be understood as the powerline frequency or as the grid frequency. With reference to FIG. 4, the frequency F is determined by determining the extremum using the arguments of the minima, abbreviated argmin. In FIG. 4, the negative logarithm of the likelihood function has its extremum at a frequency of about 50 Hz. By determining the frequency by parameter maximizing, in particular by determining the grid frequency as described herein a separate voltage measurement of the acoustic signal can be omitted, since the phase information, in particular the relative phase angle can be determined based on the determined grid frequency.

Figure 5:
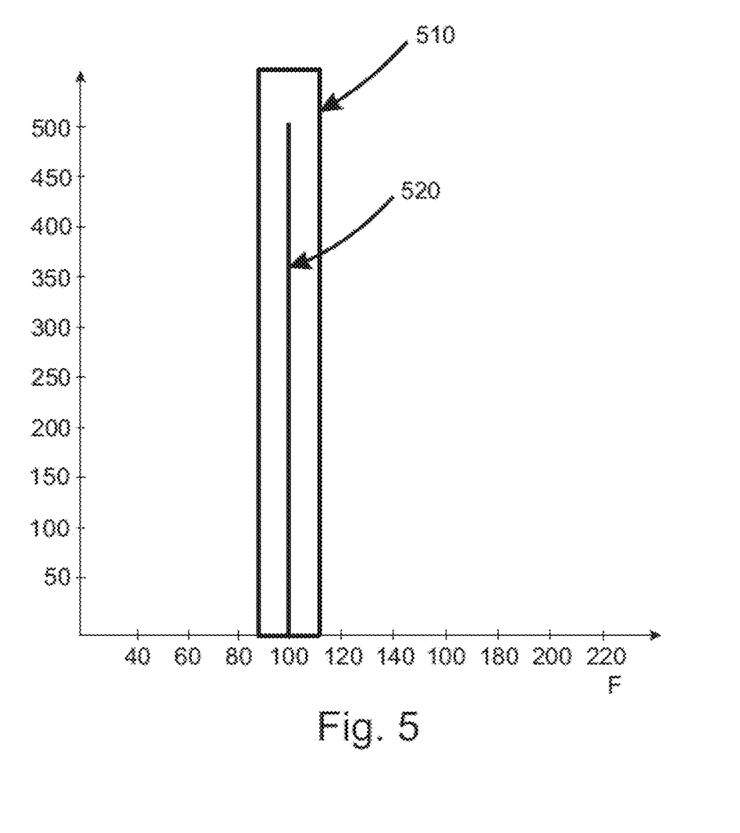
FIG. 5 illustrates schematically a further method to determine the amplitude of the signal in a certain frequency range by integrating over a window.

According to embodiments which can be combined with other embodiments described herein generating the acoustic data further comprises determining the amplitude of the acoustic peak sequences of the acoustic signal at multiples of the grid frequency by integration over a suitable window of frequencies. The frequencies are, particularly known to be possible grid frequencies. With reference to FIG. 5. a method to determine the amplitude, in particular the Fourier amplitude of the signal in a certain frequency range by integrating over a frequency window 510 is depicted. Advantageously, the determination of the amplitude becomes independent of the precise value of the frequency itself. The frequency content is determined by integrating over a frequency window 510 around the first harmonics, in particular around about twice the grid frequency, which results in the peak 520 denoting the twice frequency of the acoustic peak sequences. What is more, by determining the frequency content by integration over a suitable time window, a separate volt measurement can also be omitted, since the phase information, in particular the relative phase angle can be determined based on the determined frequency content.

A detection system for detecting an electrical discharge in an electrical apparatus is provided. The detection system includes an electrical sensor configured to measure an electromagnetic signal; an acoustic sensor configured to measure an acoustic signal, said acoustic sensor being associated with at least one compartment of the electrical apparatus; and a signal processing device configured for generating electrical data based on a quasi-periodic characteristic of electrical peak sequences of said electrical signal and for generating acoustic data based on a quasi-periodic characteristic of acoustic peak sequences of said acoustic signal; wherein the signal processing device is configured to combine the electrical data with the acoustic data to provide an operation status of the at least one compartment.

According to embodiments which can be combined with other embodiments described herein the detection system further includes at least two acoustic sensors, wherein the first acoustic sensor is configured to measures a first acoustic signal and a second acoustic sensor is configured to measure a second acoustic signal, the first acoustic sensor being associated with a first compartment of the electrical apparatus and the second acoustic sensor being associated with a second compartment of the electrical apparatus.

According to embodiments which can be combined with other embodiments described herein the acoustic sensor is a microphone, particularly a MEMS microphone.

According to embodiments which can be combined with other embodiment described herein, the electrical apparatus includes more than two compartments, each being assigned to two or more acoustic sensors.

A use of the detection system in an electrical apparatus, particularly in a medium voltage or high-voltage electrical switchgear is provided.

The invention claimed is:

1. A method for detecting an electrical discharge in an electrical apparatus, the method comprising:
    sensing an electromagnetic wave using an electrical sensor and generating an electric signal for a predetermined time period;
    sensing an acoustic wave using an acoustic sensor and generating an acoustic signal for the predetermined time period, said acoustic sensor being associated with at least one compartment of the electrical apparatus;
    generating electrical data based on a quasi-periodic characteristic of electric peak sequences of said electrical signal;
    generating acoustic data based on a quasi-periodic characteristic of acoustic peak sequences of said acoustic signal;
    wherein the electrical data is combined with the acoustic data to provide an operation status of the at least one compartment,
    wherein the electrical signal is generated only in at least one time period interval for the predetermined time period,
    wherein the acoustic signal is generated only in at least one time period interval for the predetermined time period,
    wherein the at least one time period interval of the electrical signal and the at least one time period interval of the acoustic signal are independent from each other in time.

2. The method of claim 1, wherein the acoustic signal is measured by at least a first acoustic sensor and a second acoustic sensor, wherein the first acoustic sensor measures a first acoustic signal and the second acoustic sensor measures a second acoustic signal, and wherein the first acoustic sensor is associated with a first compartment of the electrical apparatus and the second acoustic sensor is associated with a second compartment of the electrical apparatus.

3. The method of claim 1, wherein the predetermined time period is a continuous time period.

4. The method of claim 1, wherein said generating acoustic data further comprises determining a frequency of the acoustic peak sequences of the acoustic signal using parameter maximization.

5. The method of claim 1, wherein generating the acoustic data further comprises determining an amplitude of the acoustic peak sequences of the acoustic signal at multiples of a grid frequency by integration over a frequency window.

6. A detection system for detecting an electrical discharge in an electrical apparatus, the system comprising:
    an electrical sensor configured to measure an electromagnetic wave and generate an electromagnetic signal;
    an acoustic sensor configured to measure an acoustic wave and generate an acoustic signal, said acoustic sensor being associated with at least one compartment of the electrical apparatus; and
    a signal processing device configured to generate electrical data based on a quasi-periodic characteristic of electrical peak sequences of said electrical signal and configured to generating acoustic data based on a quasi-periodic characteristic of acoustic peak sequences of said acoustic signal;
    wherein the signal processing device is configured to combine the electrical data with the acoustic data to provide an operation status of the at least one compartment,
    wherein the electrical signal is generated only in at least one time period interval for the predetermined time period,
    wherein the acoustic signal is generated only in at least one time period interval for the predetermined time period,
    wherein the at least one time period interval of the electrical signal and the at least one time period interval of the acoustic signal are independent from each other in time.

7. The detection system of claim 6, further comprising at least a first acoustic sensor and a second acoustic sensor, wherein the first acoustic sensor is configured to measure a first acoustic signal and the second acoustic sensor is configured to measure a second acoustic signal, wherein the first acoustic sensor is associated with a first compartment of the electrical apparatus, and wherein the second acoustic sensor is associated with a second compartment of the electrical apparatus.

8. The detection system of claim 6, wherein the acoustic sensor is a microphone.

9. The detection system of claim 6, wherein the electrical apparatus comprising more than two compartments assigned to two or more acoustic sensors.

10. The detection system of claim 6, wherein the electrical apparatus is a medium voltage or high-voltage electrical switchgear.

11. The detection system of claim 8, wherein the acoustic sensor is a MEMS microphone.

12. A detection system for performing the method for detecting an electrical discharge in an electrical apparatus of claim 1, the system comprising:

the electrical sensor configured to measure an electromagnetic wave and generate an electromagnetic signal;

the acoustic sensor configured to measure an acoustic wave and generate an acoustic signal, said acoustic sensor being associated with at least one compartment of the electrical apparatus; and a signal processing device configured to generate electrical data based on a quasi-periodic characteristic of electrical peak sequences of said electrical signal and configured to generating acoustic data based on a quasi-periodic characteristic of acoustic peak sequences of said acoustic signal;

wherein the signal processing device is configured to combine the electrical data with the acoustic data to provide an operation status of the at least one compartment, wherein the electrical signal is generated only in at least one time period interval for the predetermined time period, wherein the acoustic signal is generated only in at least one time period interval for the predetermined time period, wherein the at least one time period interval of the electrical signal and the at least one time period interval of the acoustic signal are independent from each other in time.

* * * * *